(12) United States Patent
Nemanick et al.

(10) Patent No.: US 11,527,611 B2
(45) Date of Patent: Dec. 13, 2022

(54) METHOD OF FORMING NANOWIRE CONNECTS ON (PHOTOVOLTIAC) PV CELLS

(71) Applicant: The Aerospace Corporation, El Segundo, CA (US)

(72) Inventors: Eric Joseph Nemanick, Santa Monica, CA (US); Yao Y. Lao, Irvine, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 200 days.

(21) Appl. No.: 17/092,765

(22) Filed: Nov. 9, 2020

(65) Prior Publication Data

US 2022/0149154 A1    May 12, 2022

(51) Int. Cl.
*H01L 29/06* (2006.01)
*H01L 23/00* (2006.01)

(52) U.S. Cl.
CPC .......... *H01L 29/0669* (2013.01); *H01L 24/45* (2013.01); *H01L 24/85* (2013.01); *H01L 2224/85048* (2013.01)

(58) Field of Classification Search
CPC ..... H01L 29/0669; H01L 24/45; H01L 24/85; H01L 2224/85048
USPC ........................................................ 257/347
See application file for complete search history.

(56) References Cited

U.S. PATENT DOCUMENTS

| | | | |
|---|---|---|---|
| 3,567,902 A | 3/1971 | Stearns et al. | |
| 4,340,803 A | 7/1982 | Coyle | |
| 5,009,721 A | 4/1991 | Matsumoto et al. | |
| 5,770,273 A * | 6/1998 | Offer | C23C 4/134 427/446 |
| 6,727,579 B1 | 4/2004 | Eldridge et al. | |
| 7,390,961 B2 | 6/2008 | Aschenbrenner et al. | |
| 9,409,141 B2 | 8/2016 | Sunkara et al. | |
| 10,858,296 B1 * | 12/2020 | Myrick | C06B 45/04 |
| 2005/0268959 A1 | 12/2005 | Aschenbrenner et al. | |
| 2007/0023082 A1 | 2/2007 | Manivannan et al. | |
| 2011/0008568 A1 | 1/2011 | Kim et al. | |
| 2012/0088327 A1 | 4/2012 | Brand et al. | |
| 2013/0017145 A1 | 1/2013 | Sunkara et al. | |
| 2013/0276886 A1 | 10/2013 | Worfolk et al. | |

(Continued)

FOREIGN PATENT DOCUMENTS

| | | |
|---|---|---|
| EP | 2919275 A1 | 9/2015 |
| EP | 2993708 A4 | 4/2016 |

(Continued)

OTHER PUBLICATIONS

Coatzee, Divan, et al., "Influence of Nanoparticles on Thermal and Electrical Conductivity of Composites", Polymers, 2020, 12, 742.

(Continued)

*Primary Examiner* — Didarul A Mazumder

(74) *Attorney, Agent, or Firm* — LeonardPatel PC

(57) ABSTRACT

Interconnects may be formed to an electronic device by creating a strong bond between a wire or lead, one or more nanomaterials, and a contacting area on the electronic device. The creating of the strong bond comprises triggering low power air plasma to activate a surface of the one or more nanomaterials forcing the one or more nanomaterials to bond to the surface of the contacting area.

21 Claims, 6 Drawing Sheets

(56) References Cited

U.S. PATENT DOCUMENTS

2017/0162723 A1* 6/2017 Kavulak ............ H01L 31/0508
2018/0097129 A1 4/2018 Pass

FOREIGN PATENT DOCUMENTS

WO 2014058861 A1 4/2014
WO 2015184252 A9 3/2016
WO 2017117136 A1 7/2017

OTHER PUBLICATIONS

Yu, Feng, et al., "A Review on the Promising Plasma-Assisted Preparation of Electrocatalysts", Nanomaterials, Oct. 2019, 9 (10): 1436.

* cited by examiner

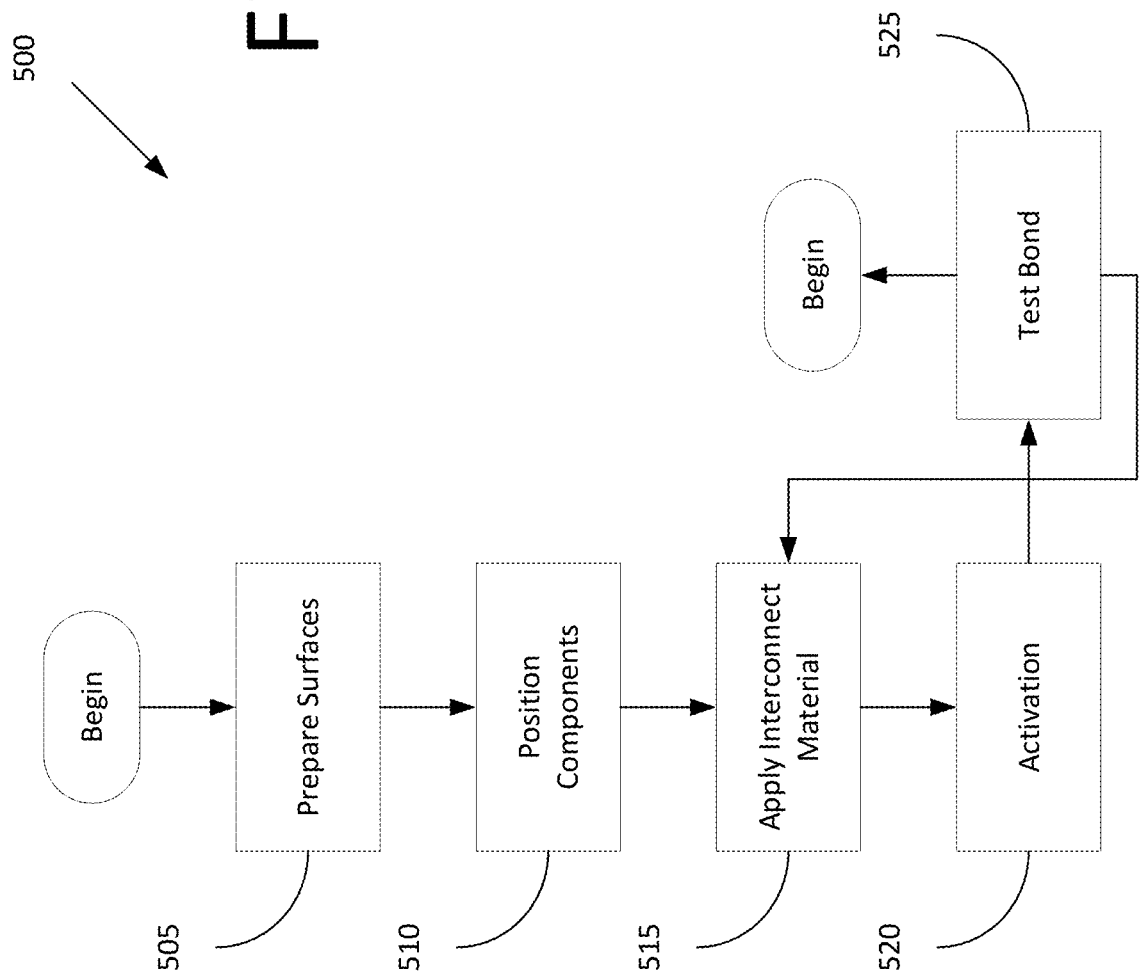

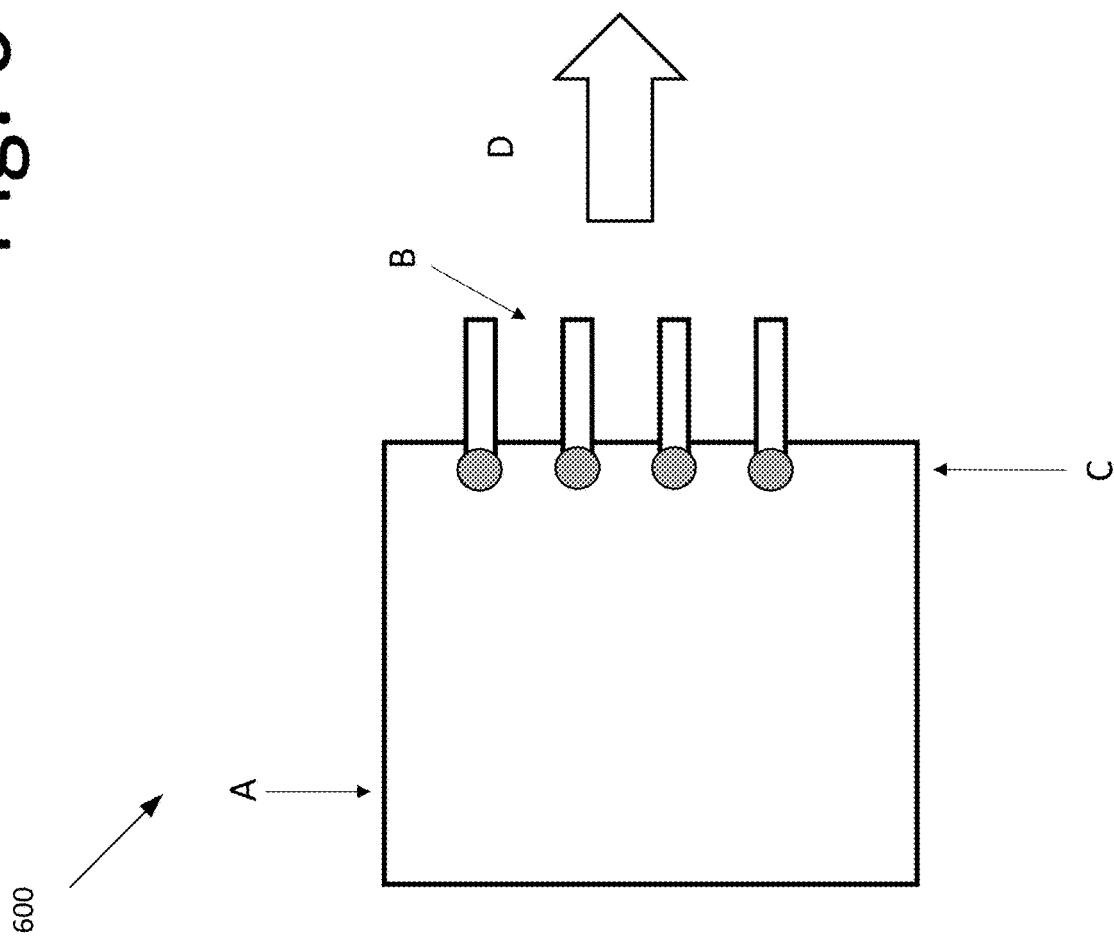

METHOD OF FORMING NANOWIRE CONNECTS ON (PHOTOVOLTIAC) PV CELLS

FIELD

The present invention relates to nanowire interconnects, and more particularly, to a nanowire interconnects forming electrical connections.

BACKGROUND

The current state of the art and most common process for bonding interconnects to photovoltaics (PV) and many other electrical components is parallel gap welding. With parallel gap welding, the interconnect is placed above the metal contact pad on a cell and two electrodes are placed against the same surface of the interconnect. The welding current flows from one electrode through the interconnect and partially through the metal contact pad, and then finally the current flows back to the power supply through the second electrode. Pressure is also applied along with the current to allow a thermal compression bond to weld the interconnect to the metal contact pad on the PV. Both the pressure and thermal effects from this bond formation can damage a PV cell or other electrical components.

Another common process for forming electrical interconnects to PV or other electrical components is soldering. With soldering, the solder is deposited onto the metal contact pad and the interconnect is placed on top. A hot soldering iron above the melting temperature of the solder is then pressed against the interconnect to melt the solder. Temperatures during bonding can exceed 400° C. The dispersed thermal energy can cause damage to the PV epitaxial structure, reducing or destroying the light harvesting capability of the adjacent material. This thermal damage can also occur to transistors, diodes, and microelectromechanical devices.

FIG. 1 is an image 100 showing scanning of an electron microscopy of a divot in a photovoltaic cell from an interconnect pull strength test. Pull strength test tests the strength of the bond between the interconnect and the cell contact. A divot into the cell is one of the failure modes. The excessive heat and force during the bonding process caused microfractures in the cell, reducing the light harvesting capability. Photoluminescence spectroscopy is shown in images 200(a) and 200(b) FIG. 2 and can be used to detect PV cells damaged from the thermal and compressive damage from the bonding process. To take this image, the cells are placed in reverse bias to emit light rather than absorb. Dark areas in images 200(a) and 200(b) show regions of thermal and/or compressive damage from bonding.

Accordingly, an improved process for forming interconnects on PV cells may be beneficial.

SUMMARY

Certain embodiments of the present invention may provide solutions to the problems and needs in the art that have not yet been fully identified, appreciated, or solved by current bonding technologies for PV cell. For example, some embodiments of the present invention pertain to a process for forming interconnects on PV cells without the application of elevated temperature, lasers, pressure, caustic chemicals, or other processes that would otherwise damage a solar cell.

In an embodiment, a method for forming interconnects to an electronic device includes creating a strong bond between a wire or lead, one or more nanomaterials, and a contacting area on the electronic device. The creating of the strong bond includes triggering low power air plasma to activate a surface of the one or more nanomaterials forcing the one or more nanomaterials to bond to the surface of the contacting area.

A method for bonding one or more wires to a surface of a metal contact includes positioning the one or more wires and the surface of the metal contact to create a mechanically sound arrangement of the one or more wires and the surface of the metal contact that is to be bonded. The method also includes applying an interconnect forming material between the one or more wires and the surface of the metal, and activating the interconnect forming material to bond the one or more wires to the surface of the metal.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 5 is a flow chart illustrating a method for bonding interconnect forming materials on the surface of the metal contact of a PV cell or other electronic device, according to an embodiment of the present invention.

FIG. 6 is flow diagram illustrating formation of multiple bonds between the surface of the PV cell metal contact and the materials, according to an embodiment of the present invention.

DETAILED DESCRIPTION OF THE EMBODIMENTS

Figure 1:
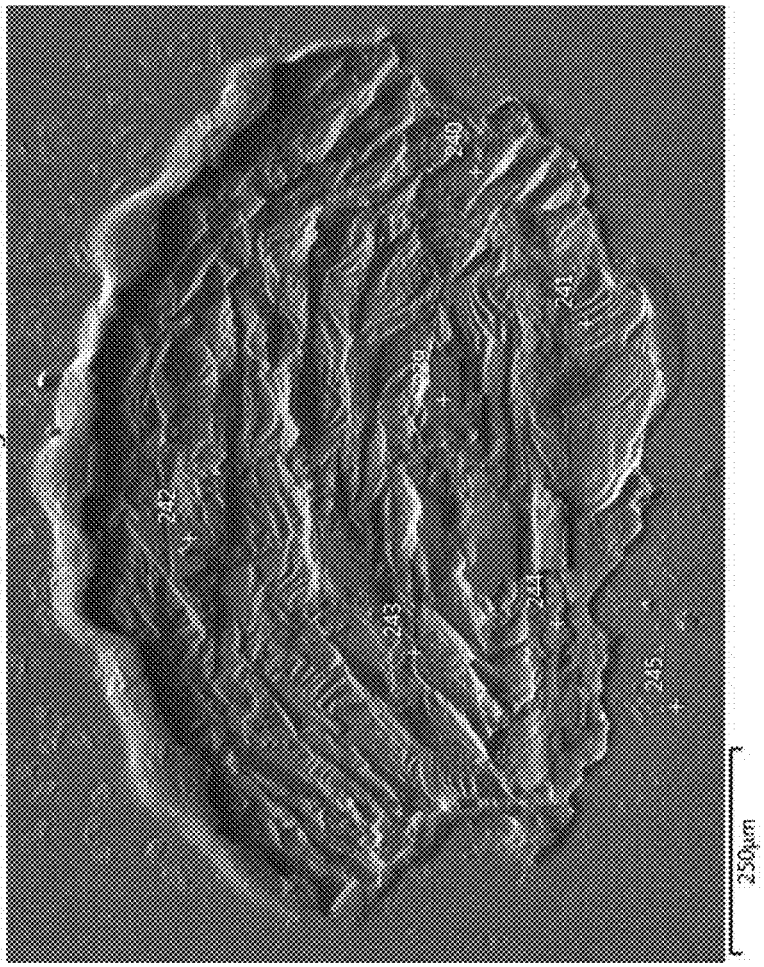
FIG. 1 is related art of an image showing scanning of an electron microscopy of a divot in a photovoltaic cell from an interconnect pull strength test.
Figure 2:
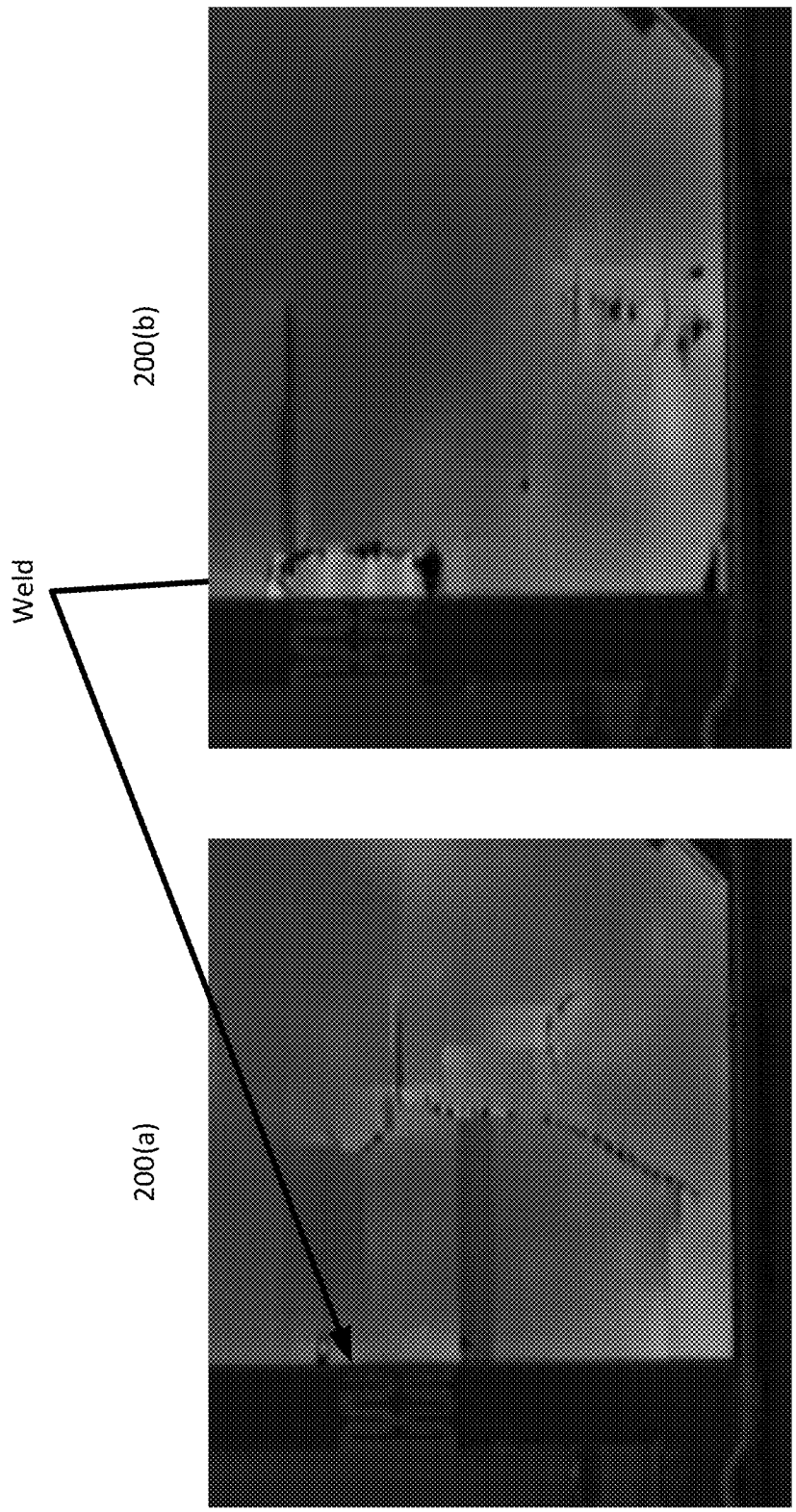
FIG. 2 is related art of images showing photoluminescence spectroscopy.

Some embodiments generally pertain to a process for forming interconnects on PV cells without the application of elevated temperature, lasers, pressure, caustic chemicals, or other processes that would otherwise damage the solar cell. By using metal nanomaterials, a strong bond is formed between contact pads and electrical leads though the inherent reactivity of the nanomaterials. A strong bond in this case is any bond of sufficient capability to resist debonding from mechanical or thermal stresses induced by the intended application. Bond strength is typically characterized through application of a simulated mechanical or thermal stress environment and testing the adhesion of the bond. If the bond fails after being subjected to an application relevant stress condition, the bond is considered weak.

In some embodiments, low power air plasma activates the surface of the nanomaterials, which then bonds with the contact pad of the solar cell. The resulting bond is strong, free of contamination, and resistant to failure. In other embodiments, the application of low temperatures or pressures can trigger the activation of the nanomaterials to form a strong bond. Low temperatures for activation are typically under 100° C., or less for sensitive components. The temperature limit may be defined by the temperature sensitivity of neighboring components. Similarly, low pressures are those typically available without pneumatic or electromechanical devices, rather the pressure of another object lying on top of the bond to be activated or through simple mechanical compression from a spring or clamp.

Metals interfaces, which do not have oxides or other contaminants on their surfaces (e.g., are very clean), may spontaneously start bonding with themselves. This process is called cold welding. With this in mind, the bond formation process may be sped up when the material interfaces are nanostructured. It should be noted that high surface area nanowires have very high surface energy and reactivity. To reduce the surface energy when in contact with each other the nanowires spontaneously begin to bond to each other to form a structure that is lower in surface area and energy, creating a strong mechanical and electrical bond in the process.

Surface energy induced reactions can be seen at the macro level in water droplets. When water droplets are not touching, the water droplets are in their own hemisphere, with an area of $4\pi r^2$. However, as soon as the water droplets touch one another, the water droplets move to minimize their energy by merging together, reducing the total surface area and energy by 25%. A similar reaction occurs with metals and other high surface area to volume features. For example, this may be seen in cold welding in space applications, where two metals that are pressed in vacuum together often bond. The vacuum environment has the effect of keeping the interfacing surfaces clean of oxides or other inhibiting coating, allowing for the bond to form.

Some embodiments describe the formation of connections between PV cells and the bus leads that connect to the PV cells. Because the PV cells are very delicate (i.e., brittle and temperature sensitive), the PV cells may be damaged from the thermal or pressure stresses during bond formation. So, instead of soldering, hot metal welding and/or ultrasonic welding (to name a few), some embodiments utilize placing nanowires (e.g., silver or gold nanowires) on the surface of the metal contact of the PV cell, and in particular, placing the nanowires between the contact pad and the lead. Thereafter, a bonding process is triggered, i.e., where the nanowires bond together to themselves, the contact pad, and the lead forming strong, continuous electrical connection. In some embodiments, the nanowires spontaneously form this bond at room temperature, forming an electrical connection. For stronger bonds, to trigger the bonding, a plasma is sparked using a high voltage electrode gap in a gas, e.g., air, nitrogen, argon, or other gas(es). The plasma cleans the surface of oxides or other inhibiting coatings, allowing the nanowires to form stronger bonds.

In certain embodiments, plasma for bond activation is created by using two electrodes and applying a strong electrical potential (as low as 10V) between the two electrodes. The electrodes are electrically biased in a gas, generating a reactive plasma. The gas can be air, oxygen, nitrogen, argon, or other gas at pressures at atmospheric pressure or lower pressures. The electrical potential splits the gas molecules or atoms into free electrons and reactive ions. These reactive ions can be used to clean a material surface by reacting with oxides, sulfides, organic contaminants, or other surface materials, revealing the underlying metallic material. This metallic material is reactive towards itself, and in contact with a neighboring material, spontaneously forms a surface to surface bond.

Although some embodiments may use silver nanowires, other embodiments may utilize nanowires that are gold, platinum, or other materials. Further, the nanowires diameters may be from 1 to 10,000 nanometers, having a high surface area to volume ratio. The nanowire length to diameter ratios may range from 10:1 to greater than 1,000,000:1.

In certain embodiments, the fabrication of suspensions, pastes, gels, or other mixtures of noble metal nanomaterials may be required, typically silver, gold, or other metal nanowires, or nanoparticles, or other nanostructured shapes. These materials may be suspended in a clean fluid medium. The nanowire suspension may then be applied to a desired bonding area and the liquid is removed either through vacuum, evaporative, thermal, or other type of drying. When the desired bonding area is free of suspending fluid, the reactivity of the nanomaterials causes a bond to be formed. For applications where stress testing of the bonds formed from drying alone indicates a stronger bond is required, a low flux plasma (as discussed above) thermal treatment, or compressive force may be applied to set the bond by cleaning the contacting nanomaterial and contact pad surfaces, to further activate the metallic bonding. This increases the bond strength and electrical conductivity.

Figure 3:
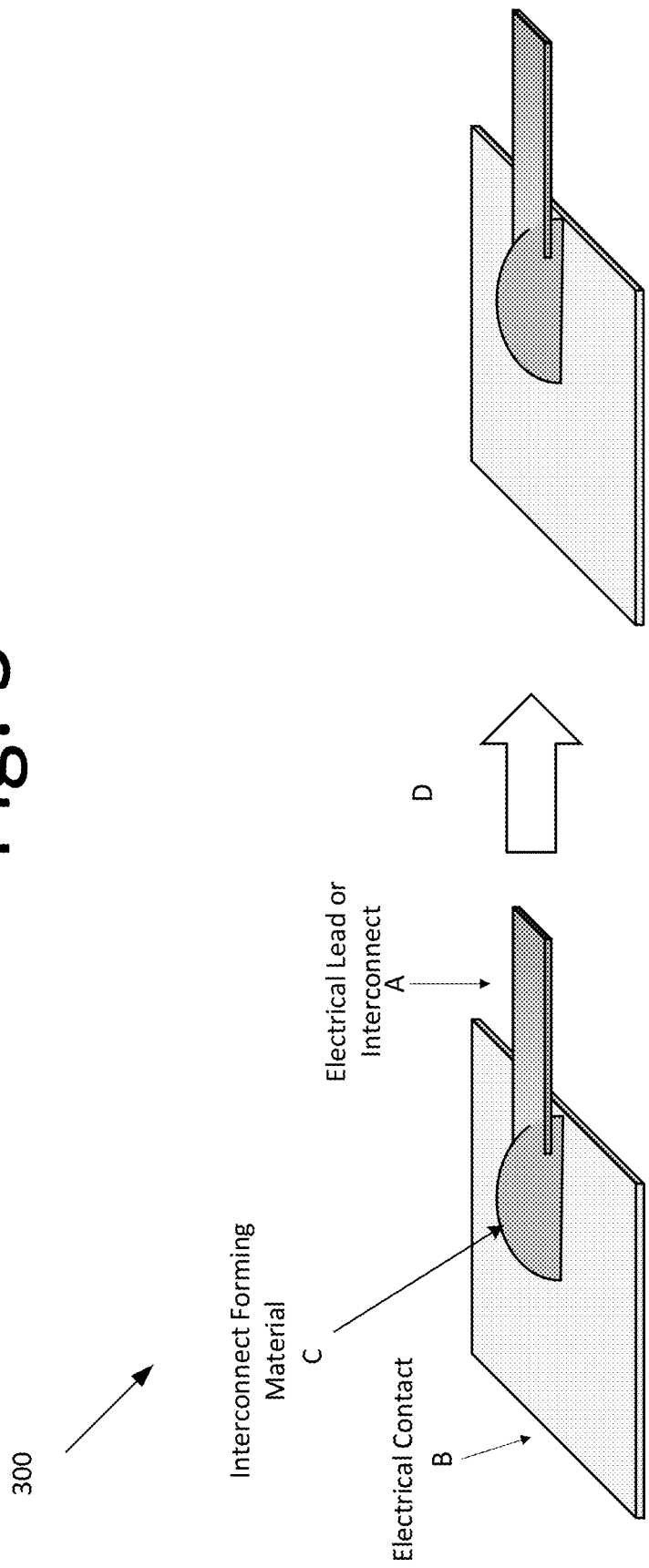
FIG. 3 is a flow diagram illustrating connection of two conductive components, according to an embodiment of the present invention.

FIG. 3 is a flow diagram 300 illustrating connection of two conductive components A and B, according to an embodiment of the present invention. In this embodiment, flow diagram 300 shows the connection of two conductive components, A and B. For purposes of explanation, conductive component A may be the surface of an electrical lead or interconnect and conductive component B may be an electrical contact on a PV cell. Although this embodiment may show a PV cell, the embodiments do not apply to only PV cells, and may apply to other electronic devices such as transistors, diodes, and photodetectors. Interconnect forming material C is added at the junction of conductive components A and B. Interconnect forming material C is the nanomaterial in a free form or in a suspension or mixture. Activation process D binds interconnect forming material C to conductive components A and B forming a continuous conductive metallic bond. Activation process D may be a plasma trigger, thermal trigger, compressive force, the passage of time, or a combination of these triggers.

It should be appreciated that the embodiments are not limited by structure, i.e., wire-to-wire or pad-to-pad bonding. For example, the embodiments, regardless of structure, may bond any material that has conductive, metallic material properties.

Figure 4:
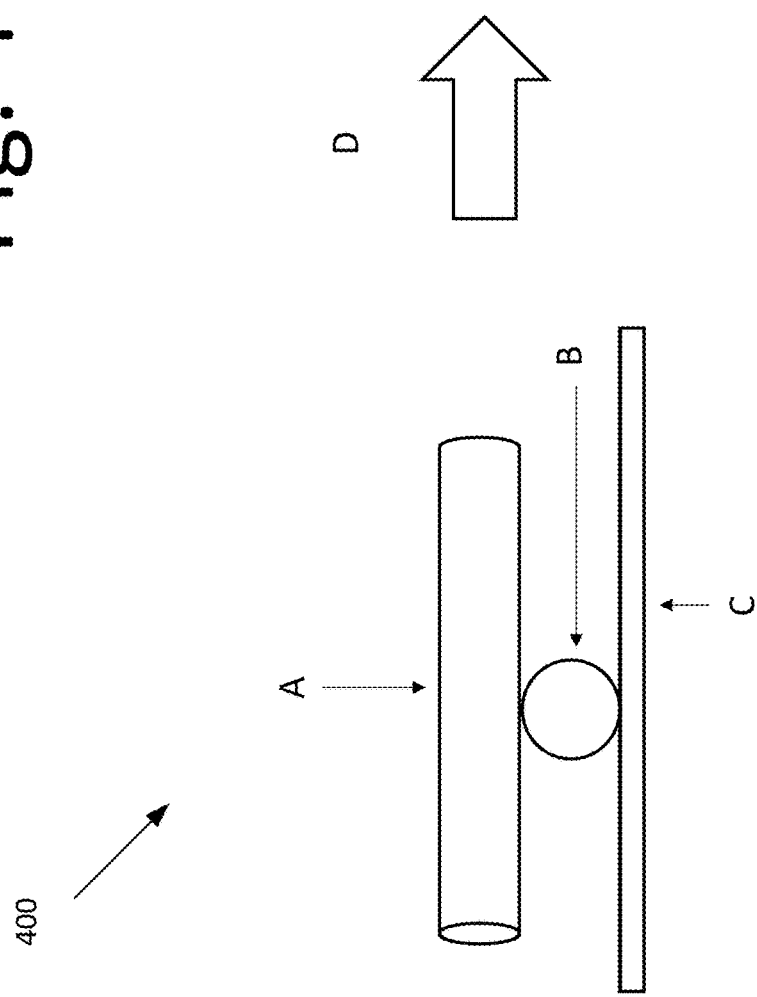
FIG. 4 is a flow diagram illustrating nanoscale bonding inside interconnect forming material structures with a conductive surface, according to an embodiment of the present invention.

FIG. 4 is a flow diagram 400 illustrating nanoscale bonding inside interconnect forming material structures A and B with a conductive surface C, according to an embodiment of the present invention. In this embodiment, free nanoscale materials A and B may include wires, particles, or other shapes, with no binding matrix or materials, and interconnect object C is the surface that materials A and B are forming a bond. After activation process D, free nanoscale materials A and B form one continuous metal-metal bond with interconnect forming material C. Activation process D may be a plasma trigger, thermal trigger, the passage of time, compressive force, or a combination of these triggers.

FIG. 5 is a flow chart illustrating a method 500 for bonding interconnect forming materials on the surface of the metal contact of a PV cell or other electronic device, according to an embodiment of the present invention. For purposes of explanation, the interconnect is the electrical connection that is to be made, and the interconnect material or interconnect forming material are one in the same. This material is used to form the junction at the heart of the interconnect.

In this embodiment, method 500 begins at 505 with preparing the surface of the metal contact on the PV cell. Surface preparation may include cleaning with mechanical or chemical means such as use of abrasives, surfactants or detergents, chemical washes such as an organic solvent, chemical cleaning such as acid or other corrosive washes, plasma cleaning, or any method for creating a clean interface surface. At 510, the components, including the substrate contact and connecting wire(s), are positioned to create a mechanically sound arrangement of the two materials to be bonded. This arrangement is determined such that mechanical or thermal stresses from the application usage or environment will not break or damage the bond. At 515, the interconnect forming nanomaterial (free, in suspension or mixture) is applied to the surface of the materials to be bonded. This interconnect forming material can be applied using a nozzle and injection system, dabbing, dropping, or other method to place the interconnect forming material in between and/or on top of the components to be bonded. At 520, this interconnect forming material is activated to start the bonding process between the interconnect forming materials and the surface of the metal contact on PV cells. Activation can be a plasma trigger, thermal trigger, the passage of time, mechanical activation (e.g., applying compressive force), or a combination of these triggers.

To trigger thermal activation, temperature is elevated to a fixed annealing temperature. The thermal activation activates the surface of the interconnect forming material forcing the interconnect forming material to bond to the surface of the metal contact. The thermal activation also lowers activation energy for bonding to begin.

To trigger mechanical activation, mechanical energy is applied to trigger a compressive bond activation. The compressive bond activation removes non-metallic atoms between the interconnect forming material and the surface of the metal contact. The compressive bond activation also mechanically pushes (e.g., by sheer force) the interconnect forming material and the surface of the metal contact to form together At 525, the bond between the interconnect forming materials and the surface of metal contact on the PV cells may be tested, and if the bond is not strong enough for the application, method 500 returns to 515. Otherwise, method 500 is completed.

In some embodiments, strength determination of the bond is measured using mechanical tests such as pull strength, vibration testing, compression testing, or shear strength testing. This may be accomplished using fixtures attached to the two bonded materials and performed at loads representative of the application for this connection. Bond strength and quality may also be characterized in the electrical conductivity of the bond. This can be accomplished by measuring the electrical resistance, conductance, or impedance of the bond though the materials that were bonded.

FIG. 6 is flow diagram 600 illustrating formation of multiple bonds between the surface of the PV cell metal contact and the materials, according to an embodiment of the present invention. In some embodiments, A is a conductive surface, and B are multiple conductive components or connections, and C are multiple locations of interconnect forming material. After sequential or simultaneous activation process(es) D, such as those executed by method 500 of FIG. 5, multiple connections are formed.

Since some embodiments do not utilize the application of heat to form the interconnect, any electronic device in proximity will not be damaged, lose efficiency, or suffer from reduced capability in the area adjacent to the interconnect.

Although some embodiments are directed to forming interconnects in solar cells in space applications, other embodiments may be directed to forming interconnects in terrestrial solar panels. In addition, this process may be used in any application where thermal damage from welding, soldering, or other types of bonding may damage the substrate or generate hazardous conditions. Particular target applications may be electronics fabrication or battery connections. Both cases require care to prevent thermal energy or mechanical force transmission from the bond to the substrate.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method for forming interconnects to an electronic device, the method comprising:
creating a strong bond between a wire or lead, one or more nanomaterials, and a contacting area on the electronic device, wherein
creating the strong bond comprises triggering low power air plasma to activate a surface of the one or more nanomaterials forcing the one or more nanomaterials to bond to a surface of the contacting area.

2. The method of claim 1, wherein the low power air plasma is triggered by an application of low temperatures or pressure.

3. The method of claim 1, wherein the low power air plasma is triggered by using a high voltage electrode gap in a gas.

4. The method of claim 1, wherein the one or more nanomaterials comprises one or more nanowires composed of silver, platinum, or gold.

5. The method of claim 4, wherein each of the one or more nanowires has diameters ranging from 1 to 10,000 nanometers, each of which has a high surface area to a volume ratio.

6. The method of claim 4, wherein each of the one or more nanowires has a length to a diameter ratio ranging from 10:1 to greater than 1,000,000:1.

7. The method of claim 1, further comprising:
preparing a surface of a contact pad on a PV cell.

8. The method of claim 1, further comprising:
placing the one or more nanomaterials between a contact pad and the lead, both of which are on a surface of the electronic device.

9. The method of claim 1, wherein the triggering of the strong bond comprises,
elevating temperature to a fixed annealing temperature to trigger a thermal activation,
the thermal activation is configured to activate the surface of the one or more nanomaterials forcing the one or more nanomaterials to bond to the surface of the contacting area, and
the thermal activation is further configured to lower an activation energy for bonding to begin.

10. The method of claim 1, wherein the triggering of the strong bond comprises,
applying a mechanical energy to trigger a compressive bond activation, the compressive bond activation to remove non-metallic atoms between the one or more nanomaterials and a surface of the contacting area, and mechanically pushes the one or more nanomaterials and the surface of the contacting area to form together.

11. A method for bonding one or more wires to a surface of a metal contact, the method comprising:
positioning the one or more wires and the surface of the metal contact to create a mechanically sound arrangement of the one or more wires and the surface of the metal contact that is to be bonded;
applying an interconnect forming material between the one or more wires and the surface of the metal contact; and
activating the interconnect forming material to bond the one or more wires to the surface of the metal contact.

12. The method of claim 11, further comprising:
preparing the surface of the metal contact, wherein preparing the surface of the metal contact comprises cleaning the surface with a mechanical mechanism, a chemical, or a plasma the surface.

13. The method of claim 11, wherein the interconnect forming material is free in suspension or a mixture.

14. The method of claim 11, wherein applying the interconnect forming material comprises applying the interconnect forming material using a nozzle and injection system, dabbing, or dropping to place the interconnect forming material in between or on top of the one or more wires and the surface of the metal contact.

15. The method of claim 11, wherein activating the interconnect forming material comprises,
triggering a low power air plasma to activate a surface of the interconnect forming material forcing the one or more wires to bond to the surface of the metal contact.

16. The method of claim 15, wherein the low power air plasma is triggered by an application of a low temperature or pressure or by using a high voltage electrode gap in a gas.

17. The method of claim 11, wherein activating the interconnect forming material comprises,
elevating a temperature to a fixed annealing temperature to trigger a thermal activation, wherein
the thermal activation is configured to activate the surface of the one or more wires forcing the one or more wires to bond to the surface of the metal contact, and
the thermal activation is further configured to lower an activation energy for bonding to begin.

18. The method of claim 11, wherein activating the interconnect forming material comprises,
applying a mechanical energy to trigger a compressive bond activation,
the compressive bond activation to remove non-metallic atoms between the one or more wires and the surface of the metal contact, and mechanically pushes the one or more wires and the surface of the metal contact to form together.

19. The method of claim 11, wherein the one or more wires comprises one or more nanowires composed of silver, platinum, or gold.

20. The method of claim 18, wherein each of the one or more nanowires has diameters ranging from 1 to 10,000 nanometers, each of which has a high surface area to a volume ratio.

21. The method of claim 18, wherein each of the one or more nanowires has a length to diameter ratio ranging from 10:1 to greater than 1,000,000:1.

* * * * *